United States Patent
Cheung et al.

(10) Patent No.: US 10,840,870 B2
(45) Date of Patent: *Nov. 17, 2020

(54) NOISE ESTIMATION USING COHERENCE

(71) Applicant: Bose Corporation, Framingham, MA (US)

(72) Inventors: Shiufun Cheung, Lexington, MA (US); Zukui Song, Wellesley, MA (US); David J. Warkentin, Boston, MA (US)

(73) Assignee: Bose Corporation, Framingham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/794,765

(22) Filed: Feb. 19, 2020

(65) Prior Publication Data

US 2020/0186115 A1 Jun. 11, 2020

Related U.S. Application Data

(63) Continuation of application No. 16/171,951, filed on Oct. 26, 2018, now Pat. No. 10,601,387.

(Continued)

(51) Int. Cl.
*H03G 3/32* (2006.01)
*H03G 5/16* (2006.01)
(Continued)

(52) U.S. Cl.
CPC .............. *H03G 3/32* (2013.01); *G06F 17/16* (2013.01); *G10L 21/034* (2013.01); *H03G 3/301* (2013.01);
(Continued)

(58) Field of Classification Search
CPC ........ H03G 3/32; H03G 3/301; H03G 3/3089; H03G 5/165; H03G 9/025; G06F 17/16; H04R 29/00
(Continued)

(56) References Cited

U.S. PATENT DOCUMENTS

| 8,897,456 B2* | 11/2014 | Sohn | H04R 25/407 |
| | | | 379/406.01 |
| 2006/0025994 A1* | 2/2006 | Christoph | H03G 5/165 |
| | | | 704/229 |
| 2010/0202631 A1* | 8/2010 | Short | H03G 3/32 |
| | | | 381/104 |

OTHER PUBLICATIONS

Jeub et al., Robust Dual-Channel Noise Power Spectral Density Estimation, Sep. 2, 2011 (Year: 2011).*

* cited by examiner

*Primary Examiner* — David L Ton
(74) *Attorney, Agent, or Firm* — Bose Corporation

(57) ABSTRACT

The technology described herein can be embodied in a method for estimating a power spectral density of noise, the method including receiving an input signal representing audio captured using a microphone. The input signal includes a first portion that represents acoustic outputs from two or more audio sources, and a second portion that represents a noise component. The method also includes iteratively modifying a frequency domain representation of the input signal, such that the modified frequency domain representation represents a portion of the input signal in which effects due to the first portion are substantially reduced. The method further includes determining, from the modified frequency domain representation, an estimate of a power spectral density of the noise, and generating a control signal configured to adjust one or more gains of an acoustic transducer. The control signal is generated based on the estimate of the power spectral density of the noise.

18 Claims, 4 Drawing Sheets

Related U.S. Application Data

(60) Provisional application No. 62/577,506, filed on Oct. 26, 2017.

(51) Int. Cl.
  *H03G 3/30* (2006.01)
  *H03G 9/02* (2006.01)
  *G10L 21/034* (2013.01)
  *G06F 17/16* (2006.01)
  *H04R 29/00* (2006.01)

(52) U.S. Cl.
  CPC .......... *H03G 3/3089* (2013.01); *H03G 5/165* (2013.01); *H04R 29/00* (2013.01); *H03G 9/025* (2013.01)

(58) Field of Classification Search
  USPC ............................................. 381/57, 98, 102
  See application file for complete search history.

US 10,840,870 B2

NOISE ESTIMATION USING COHERENCE

PRIORITY CLAIM

This Application claims priority to U.S. application Ser. No. 16/171,951 filed Oct. 26, 2018 which claims priority to U.S. Application 62/577,506, filed on Oct. 26, 2017, the entire contents of each of which are incorporated herein by reference.

TECHNICAL FIELD

This disclosure generally relates to dynamic sound adjustment, e.g., to overcome the effect of noise on sound reproduction in a moving vehicle.

BACKGROUND

The perceived quality of music or speech in a moving vehicle may be degraded by variable acoustic noise present in the vehicle. This noise may result from, and be dependent upon, vehicle speed, road condition, weather, and condition of the vehicle. The presence of noise may hide soft sounds of interest and lessen the fidelity of music or the intelligibility of speech. A driver and/or passenger(s) of the vehicle may partially compensate for the increased noise by increasing the volume of the audio system. However, when the vehicle speed decreases or the noise goes away, the increased volume of the audio system may become too high, requiring the driver or the passenger(s) to decrease the volume.

SUMMARY

In one aspect, this document features a method for estimating a power spectral density of noise, the method including receiving, at one or more processing devices, an input signal representing audio captured using a microphone. The input signal includes a first portion that represents acoustic outputs from two or more audio sources, and a second portion that represents a noise component. The method also includes iteratively modifying, by the one or more processing devices, a frequency domain representation of the input signal, such that the modified frequency domain representation represents a portion of the input signal in which effects due to the first portion are substantially reduced. The method further includes determining, from the modified frequency domain representation, an estimate of a power spectral density of the noise, and generating a control signal configured to adjust one or more gains of an acoustic transducer corresponding one or more frequency ranges. The control signal is generated based on the estimate of the power spectral density of the noise.

In another aspect, this document features a system that includes a noise analysis engine having one or more processing devices. The noise analysis engine is configured to receive an input signal representing audio captured using a microphone. The input signal includes a first portion that represents acoustic outputs from two or more audio sources, and a second portion that represents a noise component. The noise analysis engine is also configured to iteratively modify a frequency domain representation of the input signal, such that the modified frequency domain representation represents a portion of the input signal in which effects due to the first portion are substantially reduced. The noise analysis engine is further configured to determine, from the modified frequency domain representation, an estimate of a power spectral density of the noise, and generate a control signal configured to adjust one or more gains of an acoustic transducer corresponding one or more frequency ranges. The control signal is generated based on the estimate of the power spectral density of the noise.

In another aspect, this document features one or more machine-readable storage devices having encoded thereon computer readable instructions for causing one or more processing devices to perform various operations. The operations include receiving an input signal representing audio captured using a microphone, the input signal including a first portion that represents acoustic outputs from two or more audio sources, and a second portion that represents a noise component. The operations also include iteratively modifying a frequency domain representation of the input signal, such that the modified frequency domain representation represents a portion of the input signal in which effects due to the first portion are substantially reduced. The operations further include determining, from the modified frequency domain representation, an estimate of a power spectral density of the noise, and generating a control signal configured to adjust one or more gains of an acoustic transducer corresponding one or more frequency ranges, the control signal being generated based on the estimate of the power spectral density of the noise.

Implementations of the above aspects can include one or more of the following features.

The frequency domain representation can be generated, by the one or more processing devices, based on a time segment of the input signal. The frequency domain representation can include, for each frequency bin, (i) values that each represent a level of coherence between acoustic outputs from a pair of the two or more audio sources, (ii) values that each represent a level of coherence between an acoustic output of a particular audio source of the two or more audio sources and the audio captured using the microphone, and (iii) values that each represent the power of the acoustic output for the particular frequency bin, of an individual audio source of the two or more audio sources. The one or more gains of the acoustic transducer can be adjusted to increase with an increase in the estimate of the power spectral density of the noise, and decrease with a decrease in the estimate of the power spectral density. The values that each represent a level of coherence between acoustic outputs from a pair of the two or more audio sources can include one value for every permutation of pairs of the two or more audio sources. The values that each represent a level of coherence between an acoustic output of a particular audio source of the two or more audio sources and the audio captured using the microphone can include two values for each of the two or more audio sources. The values that each represent the power of the acoustic output for the particular frequency bin, of an individual audio source of the two or more audio sources can include one value for each of the two or more audio sources. The frequency domain representation can include a cross-spectral density matrix computed based on outputs of the two or more audio sources. Iteratively modifying the frequency domain representation can include executing a matrix diagonalization process on the cross-spectral density matrix. The first portion can represent acoustic outputs from three or more audio sources.

In some implementations, the technology described herein may provide one or more of the following advantages.

By deriving the power spectral density of the noise directly from an input signal, frequency-specific information (which is directly usable in various applications) about the noise can be directly computed without wasting computing resources in determining a time waveform of the noise signal first. The technology, which can be implemented based on input signals captured using a single microphone, is scalable with the number of input sources. Input sources that are highly correlated can be handled simply by omitting one or more row reduction steps in the matrix operations described herein. In some cases, this can provide significant improvements over adaptive filtration techniques that often malfunction in the presence of correlated sources.

Two or more of the features described in this disclosure, including those described in this summary section, may be combined to form implementations not specifically described herein.

The details of one or more implementations are set forth in the accompanying drawings and the description below. Other features, objects, and advantages will be apparent from the description and drawings, and from the claims.

DETAILED DESCRIPTION

The technology described in this document is directed to separating a noise signal from a microphone signal that represents captured audio from both an audio system and the noise sources. This can be used, for example, in an automotive audio system that continuously and automatically adjusts the audio reproduction in response to changing noise conditions in a vehicle cabin, to provide a uniform/consistent perceptual audio experience. Such an audio system includes a microphone that is typically placed in the vehicle cabin to measure the noise. However, because any appropriate adjustments in the audio is based on comparing an estimate of the noise with the audio from the system itself, it is important to separate the contribution of the system audio from the noise in the microphone signal. This document describes technology directed to removing, from the microphone signal, the contributions from multiple acoustic transducers, or multiple input channels of the audio system, based on estimating coherence between pairs of acoustic transducers and coherence between each acoustic transducer and the microphone signal. The estimations and removals are done iteratively using matrix operations in the frequency domain, which directly generates an estimate of the power spectral density of the time-varying noise. Computing such frequency-specific information directly without first estimating a corresponding time domain estimate of the noise results in savings of computational resources, particular for audio systems where gain adjustments are made separately for different frequency bands. The technology described herein can be implemented using signals captured by a single microphone, and is scalable for increasing number of channels/acoustic transducers in the underlying audio system.

Figure 1:
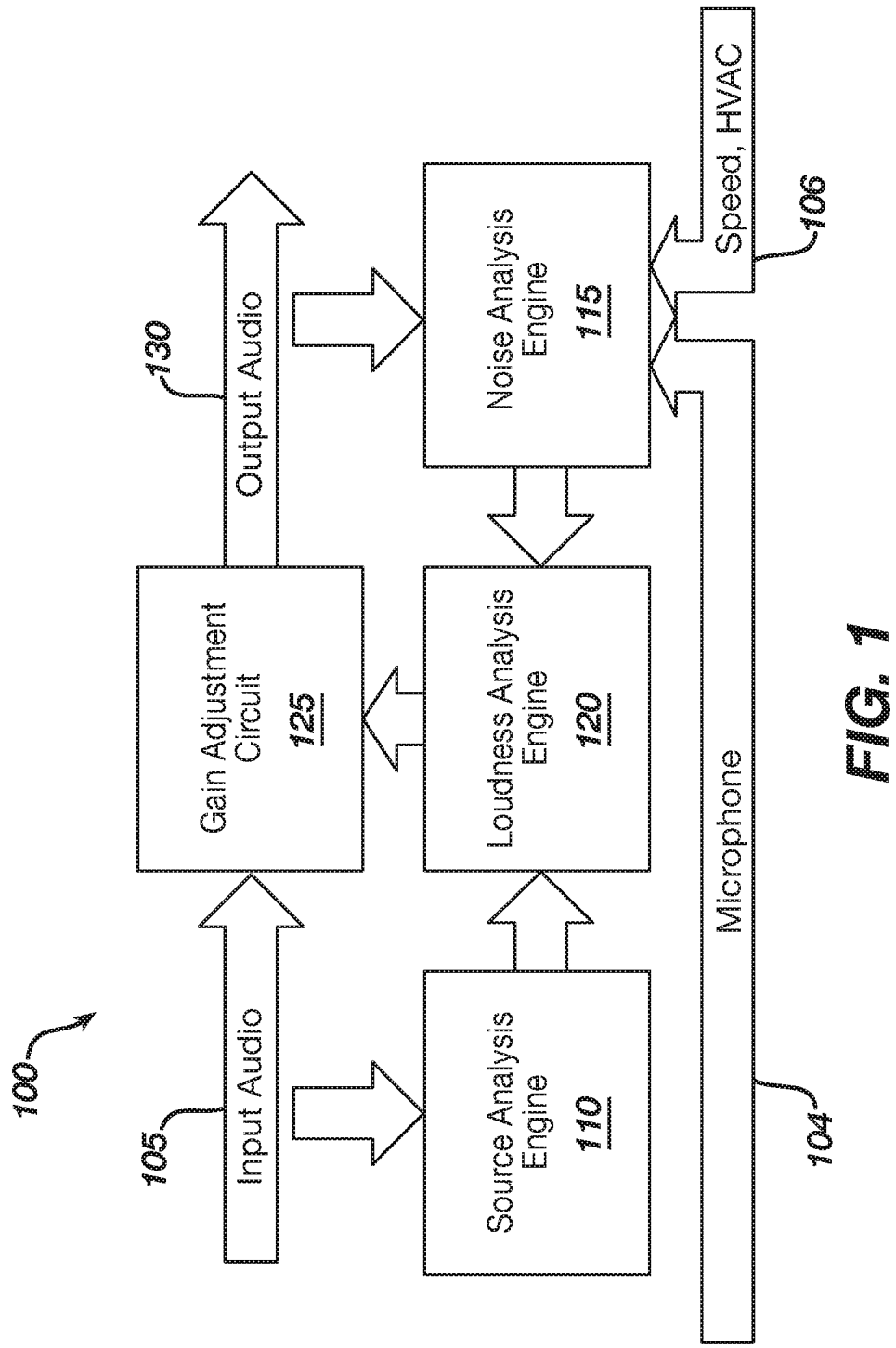
FIG. 1 is a block diagram of an example system for adjusting output audio in a vehicle cabin.

FIG. 1 is a block diagram of an example system 100 for adjusting output audio in a vehicle cabin. The input audio signal 105 is first analyzed to determine a current level of the input audio signal 105. This can be done, for example, by a source analysis engine 110. In parallel, a noise analysis engine 115 can be configured to analyze the level and profile of the noise present in the vehicle cabin. In some implementations, the noise analysis engine can be configured to make use of multiple inputs such as a microphone signal 104 and one or more auxiliary noise input 106 including, for example, inputs indicative of the vehicle speed, fan speed settings of the heating, ventilating, and air-conditioning system (HVAC) etc. In some implementations, a loudness analysis engine 120 may be deployed to analyze the outputs of the source analysis engine 110 and the noise analysis engine 115 to compute any gain adjustments needed to maintain a perceived quality of the audio output. In some implementations, the target SNR can be indicative of the quality/level of the input audio 105 as perceived within the vehicle cabin in the presence of steady-state noise. The loudness analysis engine can be configured to generate a control signal that controls the gain adjustment circuit 125, which in turn adjusts the gain of the input audio signal 105, possibly separately in different spectral bands to perform adjustments (e.g., tonal adjustments), to generate the output audio signal 130.

Figure 2:
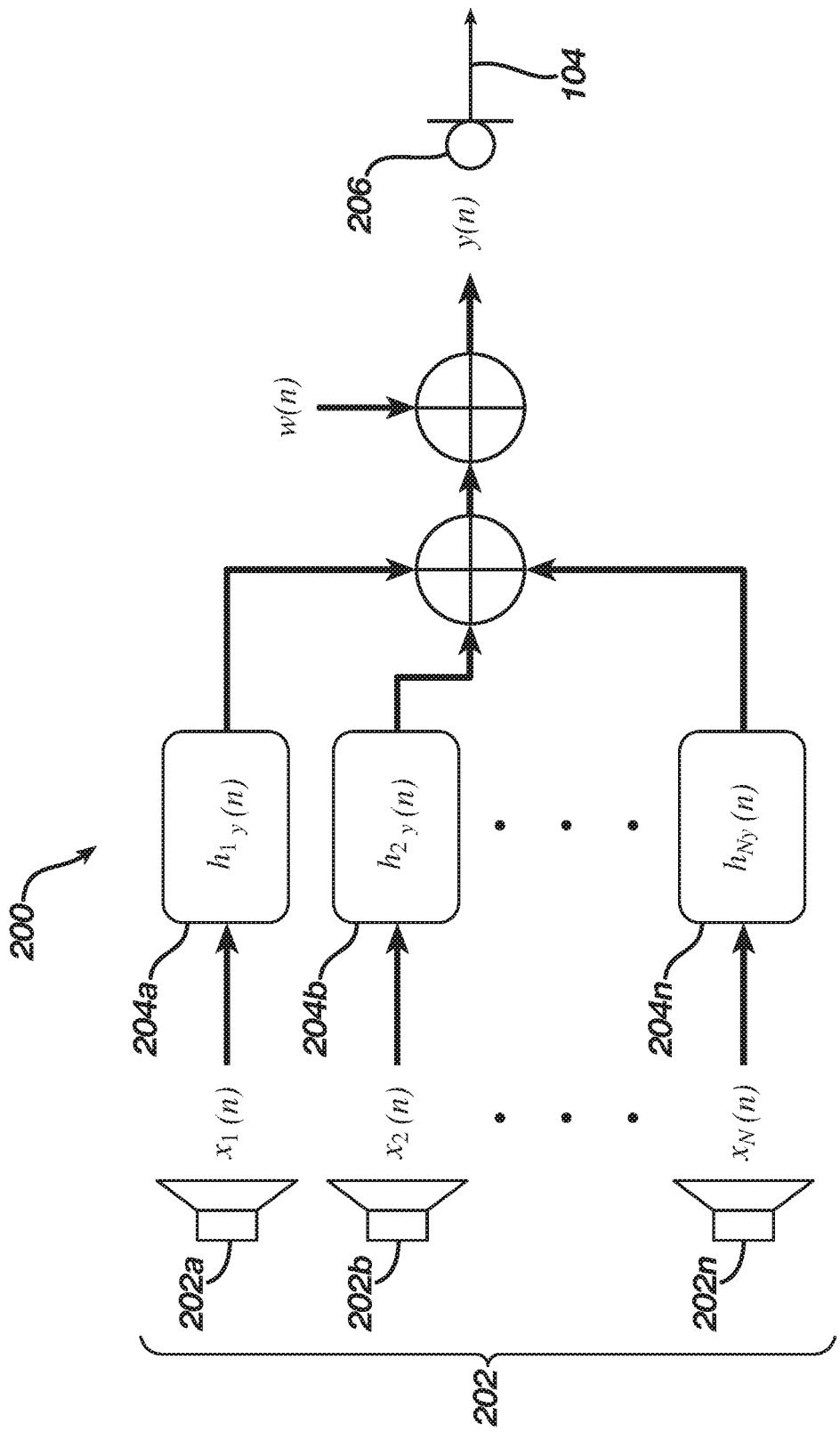
FIG. 2 is a block diagram of an example environment in which the technology described herein may be implemented.

The microphone signal 104 can include contributions from both the acoustic transducers of the underlying audio system and the noise sources. The technology described herein is directed to separating, from the microphone signal 104, the contributions from the system audio, such that the residual (after removal of the contributions from the system audio) can be taken as an estimate of the noise that may be used in further processing steps. FIG. 2 is a block diagram of an example environment 200 in which the technology described herein may be implemented. The environment 200 includes multiple acoustic transducers 202a-202n (202, in general) that generate the system audio. In some implementations, the acoustic transducers 202 generate the system audio in multiple channels. In some implementations, instead of audio outputs, the audio input channels can be directly used as inputs to the system. For example, the system audio can include 2 channels (e.g., in a stereo configuration), or 6 channels (in a 5.1 surround configuration). Other channel configurations are also possible.

In FIG. 2, the microphone signal 104 (as captured using the microphone 206) is denoted as y(n) where n is the discrete time index. The audio signals radiated from the individual acoustic transducers 202 are denoted as $x_i(n)$, and the corresponding signal paths between the acoustic transducers 202 and the microphone 206 are represented as $h_{iy}(n)$. The external noise is represented by the signal w(n). The system of FIG. 2 can thus be represented as:

$$y(n) = \sum_{i=1}^{N} (h_{iy}(n) * x_i(n)) + w(n) \quad (1)$$

where * represents the linear convolution operation. In the frequency domain, equation (1) is represented as:

$$Y = \sum_{i=1}^{N} H_{iy} X_i + W \quad (2)$$

where the capitalized form of each variable indicates the frequency domain counterpart.

This document describes, computation of an instantaneous measure—e.g., energy level, power spectral density—of the noise signal w(n), given the source signals $x_i(n)$ and the microphone signal y(n). The transfer functions $h_{iy}(n)$ are assumed to be varying and unknown. In some implementations, the determination of the instantaneous measure of the noise signal can be made using a microphone signal captured using a single microphone 206, and using the concept of coherence. Multiple coherence calculations can be executed, for example, between each of the multiple input sources and the microphone in determining the instantaneous measure of the noise signal.

For the case of two acoustic transducers only, equation (2) becomes:

$$Y = H_{1y}X_1 + H_{2y}X_2 + W \qquad (3)$$

Estimates of the auto-spectra and cross-spectra of the inputs and output signals may be computed and assembled in a cross-spectrum matrix as:

$$\begin{bmatrix} G_{11} & G_{12} & G_{1y} \\ G_{21} & G_{22} & G_{2y} \\ G_{y1} & G_{y2} & G_{yy} \end{bmatrix}$$

In some implementations, the instantaneous measure of the noise signal can be determined as the auto-spectrum of the cabin noise $G_{ww}$, which is the residual auto-spectrum of the microphone signal $G_{yy}$ after content correlated with the inputs $x_1$ and $x_2$ has been removed. This can be represented as $G_{yy\cdot 1,2}$, the auto-spectrum of the microphone signal $G_{yy}$ conditioned on the inputs $x_1$ and $x_2$. The general formula for removing the content correlated with one signal a from the cross-spectrum of two signals b and c is given by:

$$G_{bc\cdot a} = G_{bc} - \frac{G_{ba}}{G_{aa}} G_{ac} \qquad (4)$$

For an auto-spectrum $G_{bb}$, the substitution b=c in equation (4) yields:

$$\begin{aligned} G_{bb\cdot a} &= G_{bb} - \frac{G_{ba}G_{ab}}{G_{aa}} \\ &= G_{bb}\left(1 - \frac{|G_{ba}|^2}{G_{bb}G_{aa}}\right) \\ &= G_{bb}(1 - \gamma_{ab}^2) \end{aligned} \qquad (5)$$

where $\gamma_{ab}^2$ is the coherence between a and b, so that $G_{bb\cdot a}$ is the fraction of the auto-spectrum of b that is not coherent with a. Removing the content correlated with one signal from all the remaining signals is equivalent to performing one step of Gaussian elimination on the cross-spectrum matrix. If the first row of the cross-spectrum matrix above is multiplied by $$\frac{G_{21}}{G_{11}},$$

and the product is subtracted from the second row, the first step of diagonalization yields:

$$\begin{bmatrix} G_{11} & G_{12} & G_{1y} \\ G_{21} & G_{22\cdot 1} & G_{2y} \\ G_{y1} & G_{y2} & G_{yy} \end{bmatrix} \rightarrow \begin{bmatrix} G_{11} & G_{12} & G_{1y} \\ G_{21}- & G_{22}- & G_{2y}- \\ \frac{G_{21}}{G_{11}}G_{11} & \frac{G_{21}}{G_{11}}G_{12} & \frac{G_{21}}{G_{11}}G_{1y} \\ G_{y1} & G_{y2} & G_{yy} \end{bmatrix} = \begin{bmatrix} G_{11} & G_{12} & G_{1y} \\ 0 & G_{22\cdot 1} & G_{2y\cdot 1} \\ G_{y1} & G_{y2} & G_{yy} \end{bmatrix} \qquad (6)$$

Equation (6) represents the formula for conditioned cross-spectra being used in re-writing the elements (2,2) and (2,3) of the matrix. Continuing with the iterative diagonalization process, multiplication of the first row of the cross-spectrum matrix on the right-hand side of equation (6) by $$\frac{G_{y1}}{G_{11}}$$

and subtracting the product from the third row yields:

$$\begin{bmatrix} G_{11} & G_{12} & G_{1y} \\ 0 & G_{22\cdot 1} & G_{2y\cdot 1} \\ G_{y1} & G_{y2} & G_{yy} \end{bmatrix} \rightarrow \begin{bmatrix} G_{11} & G_{12} & G_{1y} \\ 0 & G_{22\cdot 1} & G_{2y\cdot 1} \\ G_{y1}- & G_{y2}- & G_{yy}- \\ \frac{G_{y1}}{G_{11}}G_{11} & \frac{G_{y1}}{G_{11}}G_{12} & \frac{G_{y1}}{G_{11}}G_{1y} \end{bmatrix} = \begin{bmatrix} G_{11} & G_{12} & G_{1y} \\ 0 & G_{22\cdot 1} & G_{2y\cdot 1} \\ 0 & G_{y2\cdot 1} & G_{yy\cdot 1} \end{bmatrix} \qquad (7)$$

The right-hand side of equation (7) represents a point in the iterative matrix diagonalization process, where content coherent with the first audio input are removed from the auto and cross-spectra of the other signals, and the 2×2 cross-spectrum matrix in the lower right corner represents the residual auto and cross-spectra conditioned on the first signal. Terms involving the second audio input stand modified to account for the case in which the two audio inputs are not entirely independent but have some correlation (e.g., as is the case for left and right stereo channels). To further reduce the effect of the second audio input from the microphone signal, the matrix diagonalization (e.g., by Gaussian elimination) can be continued on the 2×2 matrix in the lower right corner. This can include multiplying the second row by $$\frac{G_{y2\cdot 1}}{G_{22\cdot 1}}$$

and subtracting the products from the third row:

$$\begin{bmatrix} G_{11} & G_{12} & G_{1y} \\ 0 & G_{22\cdot 1} & G_{2y\cdot 1} \\ 0 & G_{y2\cdot 1} & G_{yy\cdot 1} \end{bmatrix} \rightarrow \begin{bmatrix} G_{11} & G_{12} & G_{1y} \\ 0 & G_{22\cdot 1} & G_{2y\cdot 1} \\ 0 & G_{y2\cdot 1}- & G_{yy\cdot 1}- \\ & \frac{G_{y2\cdot 1}}{G_{22\cdot 1}}G_{22\cdot 1} & \frac{G_{y2\cdot 1}}{G_{22\cdot 1}}G_{2y\cdot 1} \end{bmatrix} = \qquad (8)$$

$$\begin{bmatrix} G_{11} & G_{12} & G_{1y} \\ 0 & G_{22\cdot1} & G_{2y\cdot1} \\ 0 & 0 & G_{yy\cdot1,2} \end{bmatrix}$$

The last element in the diagonal, $G_{yy\cdot1,2}$ is the auto-spectrum of the microphone signal conditioned on the two audio inputs, which is essentially an estimate of the noise auto-spectrum $G_{ww}$. Iterative modification of the frequency domain representation of the input signal, as described above, therefore yields an estimate of power spectral density of the noise signal via removal of contributions due to the various acoustic sources.

For systems with more audio input sources such as the acoustic transducers 202, the iterative process described above can be scaled as needed to reduce the effect of content of each audio input one by one from the remaining signals. In some implementations, a subset of the audio inputs may be linearly dependent (e.g., when a stereo pair is up-mixed to more channels, for example, for a 5.1 or 7.1 configuration). In such cases, a diagonal term used in the denominator of a row reduction coefficient (e.g., $G_{22\cdot1}$ above) can have a low value (possibly zero in some cases), which in turn can lead to numerical problems. In such circumstances, row reductions using that particular row may be omitted. For example, if $$\frac{G_{y2\cdot1}}{G_{22\cdot1}} < 0.01,$$

that implies that 99% of the power in the original auto-spectrum of the output of the second acoustic transducer has already been accounted for by the operations involving the auto and cross-spectra of the output of the first acoustic transducer. Accordingly, a separate row reduction using the output of the second acoustic transducer may be avoided without significantly affecting the noise estimate.

Figure 3:
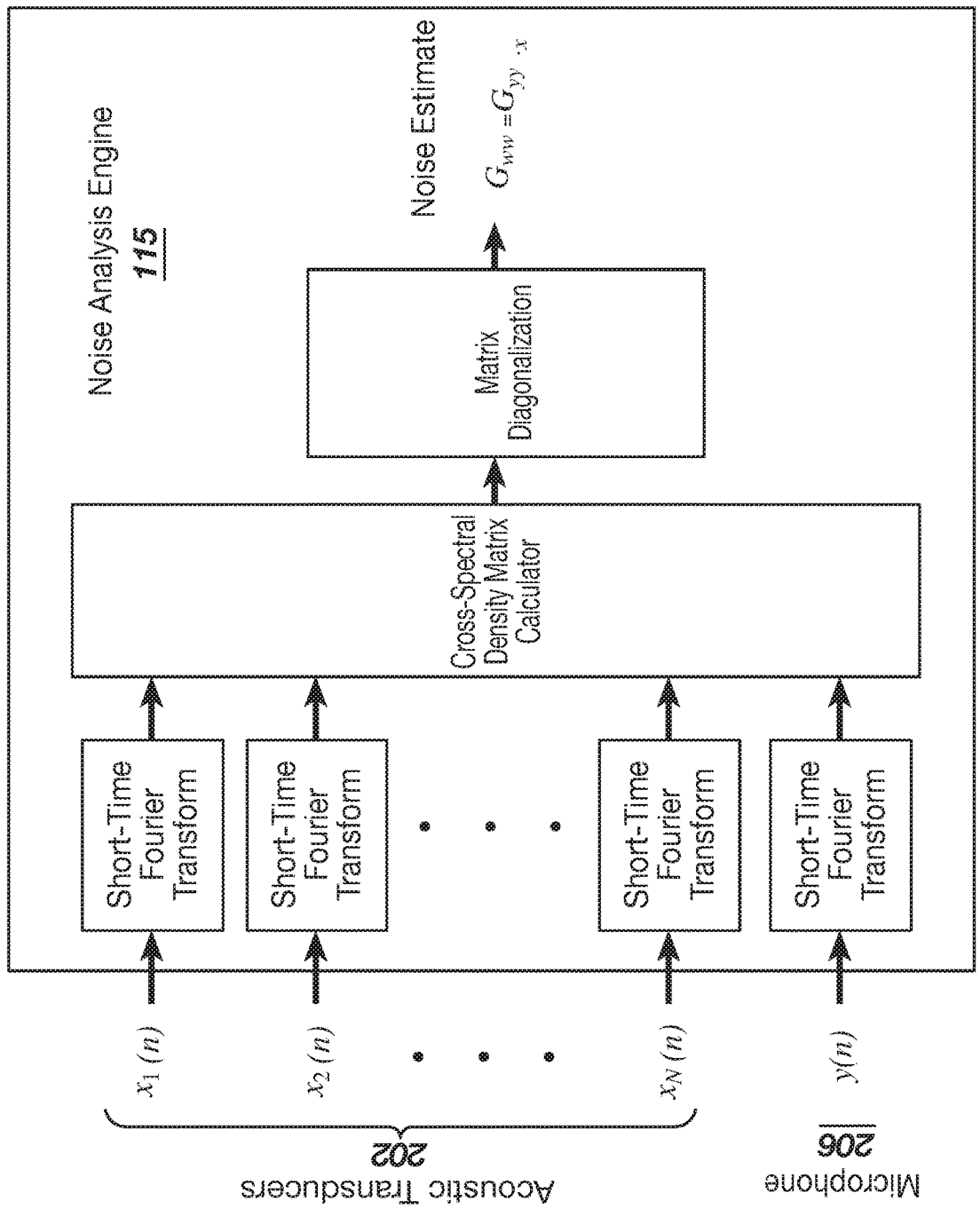
FIG. 3 is a block diagram of an example system that may be used for implementing the technology described herein.

The scalability aspect of the technology is illustrated with reference to FIG. 3, which shows a block diagram of an example system that may be used for implementing the technology described herein. In some implementations, the system includes the noise analysis engine 115 described above with reference to FIG. 1, wherein the noise analysis engine 115 receives as inputs the signals $x_i(n)$ driving the corresponding acoustic transducers 202. The noise analysis engine 115 also receives as input the microphone signal $y(n)$ as captured by the microphone 206.

In some implementations, the noise analysis engine 115 is configured to capture/use time segments of the N system audio sources $x_i(n)$, i=1, 2, . . . , N, as well as that of $y(n)$ from the microphone 206. In some implementations, the noise analysis engine is configured to apply appropriate windowing to the time segments. The noise analysis engine 115 is also configured to compute a frequency domain representation from the time segments of each input. For example, the noise analysis engine 115 may compute Fourier transforms of the windowed time segments to get spectra $X_i(f)$ and $Y(f)$. These spectra essentially represent one time-slice of the short-time Fourier transforms (STFT) of the signals. The noise analysis engine 115 is further configured to compute the cross-spectral density matrix, for example, by forming products and averaging over several time slices to generate a representation of the following matrix:

$$\begin{bmatrix} G_{11} & G_{12} & \ldots & G_{1N} & G_{1y} \\ G_{21} & G_{22} & \ldots & G_{2N} & G_{2y} \\ \vdots & \vdots & \ddots & \vdots & \vdots \\ G_{N1} & G_{N2} & \ldots & G_{NN} & G_{Ny} \\ G_{y1} & G_{y2} & \ldots & G_{yN} & G_{yy} \end{bmatrix}$$

where $G_{ij}=E\{X_i^*X_j\}$, $G_{iy}=E\{X_i^*Y\}$, and $G_{yy}=E\{Y^*Y\}$. In some implementations, the operation $E\{\cdot\}$ can be approximated by applying a single-order low pass filter.

For the iterative process, the noise analysis engine 115 is configured to use a matrix diagonalization process (e.g., Gaussian elimination) on rows of the matrix to make the matrix upper triangular as follows:

$$\begin{bmatrix} G_{11} & G_{12} & \ldots & \ldots & \ldots \\ 0 & G_{22\cdot1} & G_{23\cdot1} & \ldots & \ldots \\ \vdots & \vdots & \ddots & \vdots & \vdots \\ 0 & 0 & \ldots & G_{NN\cdot(N-1)!} & \vdots \\ 0 & 0 & \ldots & 0 & G_{yy\cdot x} \end{bmatrix}$$

where $G_{ii\cdot j!}$ is the auto-spectrum of the signal $x_i(n)$ conditioned on all the previous sources $x_k(n)$, k=1, 2, . . . , j. As discussed above, a row reduction step may be omitted for numerical stability if a particular diagonal term used is small (e.g., less than a threshold).

The last element on the diagonal in the upper triangular matrix $G_{yy\cdot x}$ is the power spectral density of the microphone signal $y(n)$ conditioned on all the system audio source signals $x_i(n)$, i=1, 2, . . . , N, and can be considered to be equivalent to the power spectral density estimate $G_{ww}$ of the cabin noise not due to the known system audio content. The power spectral density is in the form of a frequency vector, and therefore provides frequency specific information about the noise.

The above steps derive the noise estimate corresponding to one particular time segment. The procedure can be repeated for subsequent time segments to provide a running instantaneous measure of the noise. Such instantaneous measures of the noise can be used for further processing, such as in adjusting the gain of an audio system in accordance with the instantaneous noise. In some implementations, such gain adjustments may be performed separately for different frequency bands such as ranges corresponding to bass, mid-range, and treble.

Overall, the technology described herein can be used to mitigate effects of variable noise on the listening experience by adjusting, automatically and dynamically, the music or speech signals played by an audio system in a moving vehicle. In some implementations, the technology can be used to promote a consistent listening experience without typically requiring significant manual intervention. For example, the audio system can include one or more controllers in communication with one or more noise detectors. An example of a noise detector includes a microphone placed in a cabin of the vehicle. The microphone is typically placed at a location near a user's ears, e.g., along a headliner of the passenger cabin. Other examples of noise detectors can include speedometers and/or electronic transducers capable of measuring engine revolutions per minute, which in turn can provide information that is indicative of the level of noise perceived in the passenger cabin. An example of a controller includes, but is not limited to, a processor, e.g., a microprocessor. The audio system can include one or more of the source analysis engine 110, loudness analysis engine 120, noise analysis engine 115, and gain adjustment circuit 125. In some implementations, one or more controllers of the audio system can be used to implement one or more of the above described engines.

Figure 4:
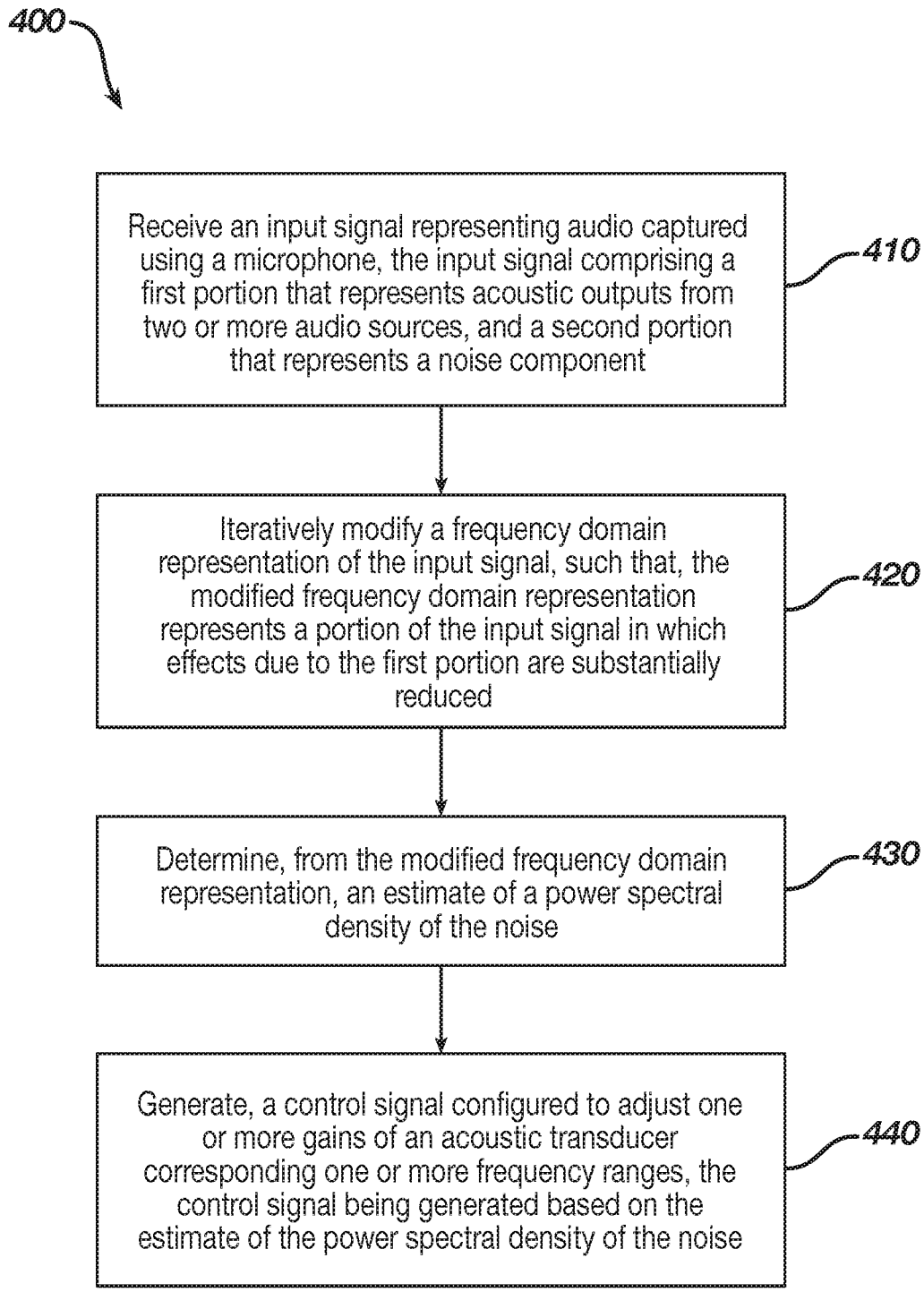
FIG. 4 is a flow chart of an example process for estimating a power spectral density of a noise signal.

FIG. 4 is a flow chart of an example process 400 for estimating a power spectral density of noise in accordance with the technology described herein. In some implementations, the operations of the process 400 can be executed, at least in part, by the noise analysis engine 115 described above. Operations of the process 400 includes receiving an input signal representing audio captured using a microphone, the input signal including a first portion that represents acoustic outputs from two or more audio sources, and a second portion that represents a noise component; (410). In some implementations, the microphone is disposed inside a vehicle cabin. The first portion can include, for example, the acoustic outputs from the two or more audio sources, as processed by a signal path between the microphone and corresponding acoustic transducers. In some implementations, the first portion represents acoustic outputs from three or more audio sources.

Operations of the process 400 can also include iteratively modifying a frequency domain representation of the input signal, such that the modified frequency domain representation represents a portion of the input signal in which effects due to the first portion are substantially reduced (420). The frequency domain representation can be based on a time segment of the input signal. In some implementations, the frequency domain representation includes, for each frequency bin, values that each represent a level of coherence between acoustic outputs from a pair of the two or more audio sources, values that each represent a level of coherence between an acoustic output of a particular audio source of the two or more audio sources and the audio captured using the microphone, and values that each represent the power of the acoustic output for the particular frequency bin, of an individual audio source of the two or more audio sources. In some implementations, the values that each represent a level of coherence between acoustic outputs from a pair of the two or more audio sources include one value for every permutation of pairs of the two or more audio sources. In some implementations, the values that each represent a level of coherence between an acoustic output of a particular audio source of the two or more audio sources and the audio captured using the microphone include two values for each of the two or more audio sources. In some implementations, the values that each represent the power of the acoustic output for the particular frequency bin, of an individual audio source of the two or more audio sources include one value for each of the two or more audio sources.

In some implementations, the frequency domain representation can include a cross-spectral density matrix computed based on outputs of the two or more audio sources. Iteratively modifying the frequency domain representation can include executing a matrix diagonalization process on the cross-spectral density matrix.

Operations of the process 400 also includes determining, from the modified frequency domain representation, an estimate of a power spectral density of the noise (430), and generating a control signal configured to adjust one or more gains of an acoustic transducer corresponding one or more frequency ranges (440). The control signal being generated can be based on the estimate of the power spectral density of the noise. For example, the one or more gains of the acoustic transducer are adjusted to increase with an increase in the estimate of the power spectral density of the noise, and decrease with a decrease in the estimate of the power spectral density Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example a programmable digital processor, a digital computer, or multiple digital processors or computers. The apparatus can also be or further include special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a standalone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit). For a system of one or more computers to be "configured to" perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Control of the various systems described in this specification, or portions of them, can be implemented in a computer program product that includes instructions that are stored on one or more non-transitory machine-readable storage media, and that are executable on one or more processing devices. The systems described in this specification, or portions of them, can be implemented as an apparatus, method, or electronic system that may include one or more processing devices and memory to store executable instructions to perform the operations described in this specification.

While this specification contains many specific implementation details, these should not be construed as limitations on the scope of any claims or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for estimating a power spectral density of noise, the method comprising:
    receiving, at one or more processing devices, an input signal having a first portion that includes acoustic outputs from two or more audio sources;
    iteratively modifying, by the one or more processing devices, a frequency domain representation of the input signal, such that the modified frequency domain representation represents a portion of the input signal in which effects due to the first portion are substantially reduced;
    determining, from the modified frequency domain representation, an estimate of a power spectral density of a noise portion of the input signal; and
    adjusting a gain of an acoustic transducer based on the estimate of the power spectral density of the noise.

2. The method of claim 1, wherein the frequency domain representation includes, for each frequency bin:
    (i) values that each represent a level of coherence between acoustic outputs from a pair of the two or more audio sources,
    (ii) values that each represent a level of coherence between an acoustic output of a particular audio source of the two or more audio sources and the input signal, and
    (iii) values that each represent the power of the acoustic output for the particular frequency bin, of an individual audio source of the two or more audio sources.

3. The method of claim 2, wherein,
    (i) the values that each represent a level of coherence between acoustic outputs from a pair of the two or more audio sources include one value for every permutation of pairs of the two or more audio sources,
    (ii) the values that each represent a level of coherence between an acoustic output of a particular audio source of the two or more audio sources and the input signal include two values for each of the two or more audio sources, and
    (iii) the values that each represent the power of the acoustic output for the particular frequency bin, of an individual audio source of the two or more audio sources include one value for each of the two or more audio sources.

4. The method of claim 1, wherein the gain of the acoustic transducer is adjusted to increase with an increase in the estimate of the power spectral density of the noise, and decrease with a decrease in the estimate of the power spectral density.

5. The method of claim 1, wherein the frequency domain representation comprises a cross-spectral density matrix computed based on outputs of the two or more audio sources.

6. The method of claim 5, wherein iteratively modifying the frequency domain representation comprises executing a matrix diagonalization process on the cross-spectral density matrix.

7. A system comprising:
a noise analysis engine comprising one or more processing devices, the noise analysis engine configured to:
receive an input signal having a first portion that represents acoustic outputs from two or more audio sources;
iteratively modify a frequency domain representation of the input signal, such that the modified frequency domain representation represents a portion of the input signal in which effects due to the first portion are substantially reduced;
determine, from the modified frequency domain representation, an estimate of a power spectral density of a noise portion of the input signal; and
adjust a gain of an acoustic transducer based on the estimate of the power spectral density of the noise.

8. The system of claim 7, wherein the frequency domain representation includes, for each frequency bin:
(i) values that each represent a level of coherence between acoustic outputs from a pair of the two or more audio sources,
(ii) values that each represent a level of coherence between an acoustic output of a particular audio source of the two or more audio sources and the input signal, and
(iii) values that each represent the power of the acoustic output for the particular frequency bin, of an individual audio source of the two or more audio sources.

9. The system of claim 8, wherein,
(i) the values that each represent a level of coherence between acoustic outputs from a pair of the two or more audio sources include one value for every permutation of pairs of the two or more audio sources,
(ii) the values that each represent a level of coherence between an acoustic output of a particular audio source of the two or more audio sources and the input signal include two values for each of the two or more audio sources, and
(iii) the values that each represent the power of the acoustic output for the particular frequency bin, of an individual audio source of the two or more audio sources include one value for each of the two or more audio sources.

10. The system of claim 7, wherein the gain of the acoustic transducer is adjusted to increase with an increase in the estimate of the power spectral density of the noise, and decrease with a decrease in the estimate of the power spectral density.

11. The system of claim 7, wherein the frequency domain representation comprises a cross-spectral density matrix computed based on outputs of the two or more audio sources.

12. The system of claim 11, wherein iteratively modifying the frequency domain representation comprises executing a matrix diagonalization process on the cross-spectral density matrix.

13. One or more machine-readable storage devices having encoded thereon computer readable instructions for causing one or more processing devices to perform operations comprising:
receiving an input signal having a first portion that represents acoustic outputs from two or more audio sources;
iteratively modifying a frequency domain representation of the input signal, such that the modified frequency domain representation represents a portion of the input signal in which effects due to the first portion are substantially reduced;
determining, from the modified frequency domain representation, an estimate of a power spectral density of a noise portion of the input signal; and
adjusting a gain of an acoustic transducer based on the estimate of the power spectral density of the noise.

14. The one or more machine-readable storage devices of claim 13, wherein the frequency domain representation includes, for each frequency bin:
(i) values that each represent a level of coherence between acoustic outputs from a pair of the two or more audio sources,
(ii) values that each represent a level of coherence between an acoustic output of a particular audio source of the two or more audio sources and the input signal, and
(iii) values that each represent the power of the acoustic output for the particular frequency bin, of an individual audio source of the two or more audio sources.

15. The one or more machine-readable storage devices of claim 14, wherein,
(i) the values that each represent a level of coherence between acoustic outputs from a pair of the two or more audio sources include one value for every permutation of pairs of the two or more audio sources,
(ii) the values that each represent a level of coherence between an acoustic output of a particular audio source of the two or more audio sources and the input signal include two values for each of the two or more audio sources, and
(iii) the values that each represent the power of the acoustic output for the particular frequency bin, of an individual audio source of the two or more audio sources include one value for each of the two or more audio sources.

16. The one or more machine-readable storage devices of claim 13, wherein the gain of the acoustic transducer is adjusted to increase with an increase in the estimate of the power spectral density of the noise, and decrease with a decrease in the estimate of the power spectral density.

17. The one or more machine-readable storage devices of claim 13, wherein the frequency domain representation comprises a cross-spectral density matrix computed based on outputs of the two or more audio sources.

18. The one or more machine-readable storage devices of claim 17, wherein iteratively modifying the frequency domain representation comprises executing a matrix diagonalization process on the cross-spectral density matrix.

\* \* \* \* \*